(12) United States Patent
Miyazawa

(10) Patent No.: US 6,331,799 B1
(45) Date of Patent: Dec. 18, 2001

(54) BIAS CIRCUIT FOR CONTROL INPUT OF POWER TRANSISTOR

(75) Inventor: Naoyuki Miyazawa, Yamanashi-ken (JP)

(73) Assignee: Fujitsu Quantum Devices Limited, Yamanahi (JP)

(*) Notice: Subject to any disclaimer, the term of this patent is extended or adjusted under 35 U.S.C. 154(b) by 0 days.

(21) Appl. No.: 09/502,469

(22) Filed: Feb. 11, 2000

(30) Foreign Application Priority Data

Feb. 26, 1999 (JP) .................................................. 11-051772

(51) Int. Cl.[7] ....................................................... G05F 1/10
(52) U.S. Cl. ................................................................ 327/538
(58) Field of Search ..................................... 327/513, 530, 327/534, 535, 537, 538, 540

(56) References Cited

U.S. PATENT DOCUMENTS 3,828,241 * 8/1974 Horichi ............................... 323/22 T
4,485,313 * 11/1984 Nagano ................................. 307/296

FOREIGN PATENT DOCUMENTS

| 59-182757 | 10/1984 | (JP) . |
| 2-54629 | 2/1990 | (JP) . |
| 8-139542 | 5/1996 | (JP) . |
| 8-274557 | 10/1996 | (JP) . |

* cited by examiner

*Primary Examiner*—Jeffrey Zweizig
(74) *Attorney, Agent, or Firm*—Arent Fox Kintner Plotkin & Kahn

(57) ABSTRACT

In a Q0 bias circuit 20B, a current source transistor Q4 is serially connected to the emitter of an emitter follower transistor Q1, the base potential of the transistor Q4 is adjusted by a current source control circuit 50 so that the emitter current IE1 of the transistor Q1 is kept approximately constant even though the base bias current IB0 of a power transistor Q0 changes. In stead of an RF signal cut-off coil L1, resistors may be connected between the emitter of the transistor Q1 and the base of the power transistor Q0, and between the collector of the transistor Q4 and the base of the power transistor Q0. Connecting of the current source may be between the base of the transistor Q1 and the grounded line.

21 Claims, 14 Drawing Sheets

US 6,331,799 B1

BIAS CIRCUIT FOR CONTROL INPUT OF POWER TRANSISTOR

BACKGROUND OF THE INVENTION

1. Field of the Invention

The present invention relates to a bias circuit for a control input of a power transistor especially in a power amplifier circuit.

2. Description of the Related Art

FIG. 12 is a schematic block diagram showing a prior art portable telephone.

In a case where speech is transmitted, the speech is sampled and digitized in a speech processing circuit 10, subjected to diffusion modulation in a base band circuit 11, then to orthogonal modulation in an IF & RF circuit 12 using an intermediate frequency and further converted into RF frequencies, and provided as an RF input power RFIN to a power amplifier circuit 14 of an RF front-end circuit 13. The RF output power RFOUT of the power amplifier circuit 14 is provided through a duplexer 15 to an antenna 16.

A signal received by the antenna 16 is provided through the duplexer 15 to a low noise amplifier 17 and the signal is processed reversely to the above case in the IF & RF circuit 12, the base band circuit 11 and the speech processing circuit 10, and speech is thus reproduced.

FIG. 13 shows a diagram of a prior art power amplifier circuit 14 in FIG. 12.

In a power transistor Q0, the emitter is grounded and the collector is connected through an RF cut-off coil L0 to a power supply potential VCC0. To the base of the power transistor Q0, on one hand, the RF input power RFIN, which is a high frequency digital modulation signal, is provided and on the other hand, a base bias current IB0 that determines an operating point is provided through the emitter of a transistor Q1 of a Q0 bias circuit 20 and a coil L1. The coil L1 is employed for prevention of the RF input power RFIN from being transmitted to the Q0 bias circuit 20 and small part of an RF signal that have passed through the RF coil L1 will be absorbed in a capacitor C1. An RF output power RFOUT obtained by power amplification of the RF input power RFIN is taken out from the collector of the power transistor Q0.

In the transistor Q1, the collector is connected to a power supply potential VCC1, the base is connected to the output of a Q1 bias circuit 30 and the emitter is connected through a resistor R1 to a ground line. In order to compensate a temperature drift in the transistor Q1 and the power transistor Q0, the PN junction between the base and emitter of transistor Q2 is serially connected to that of a transistor Q3 in a corresponding manner to a serial connection of the PN junction between the base and emitter of the transistor Q1 to that of the transistor Q0. Since forward saturation voltage of PN junction is about 1.3V, the base potential of the transistor Q1 is about 2.6V. Increase in base bias current IB0 when temperature rises is suppressed since a voltage between the base and emitter of each of the transistors Q2 and Q3 falls and thereby the base potential of the transistor Q1 falls. Resistors R2 and R3 have bias resistances for the transistors Q2 and Q3, respectively.

A portable telephone requires reduction of RF output power depending on a communication state in order to decrease power consumption and besides, requires prevention of deterioration in a tone quality. Hence, high power efficiency and high linearity in operating the power transistor Q0 are required in a broad power range. An operating point is set to the AB class in order to meet requirements for high efficiency and high linearity, which is inherently incompatible with each other.

As the amplitude of the RF input power RFIN increases, the collector bias current IC0 of the power transistor Q0 increases, and proportionally to this the base bias current IB0 of the power transistor Q0 also increases. The emitter current IE1 of the transistor Q1 increases with increase in the current IB0, and the voltage VBE1 between the base and emitter of the transistor Q1 also rises. Therefore, the base bias voltage of the power transistor Q0 falls. For example, when the base bias current IB0 increases by a factor of about 10, the voltage falls by several tens of mV, so that the operating point of the power transistor Q0 which has been set so as to optimize power efficiency and linearity is deviated toward deterioration.

In order to prevent such deterioration, the variation rate of the current IE1=I1+IB0 is reduced by decreasing the resistance value of the resistor R1 and in turn increasing the current I1 which flows through the resistor R1 so as to be large as compared with the base bias current IB0, resulting in suppressing the falling of the voltage VBE1 between the base and emitter of the transistor Q1. However, since there is a necessity to provide a comparative large current I1, which does not contribute to RF amplification, to the resistor R1, power efficiency is worsened.

FIG. 14 shows another prior art power amplifier circuit 14A.

In a Q0 bias circuit 20A of the circuit 14A, a transistor Q4 in diode connection is employed as a constant voltage source instead of the resistor R1 of FIG. 13. In order to suppress the change in voltage within tens of mV by the transistor Q4, however, it is necessary to reduce the change in current density through the PN junction, which entails a larger size of the transistor Q4. Hence, the chip area of a semiconductor integrated circuit including the Q0 bias circuit 20A and the power transistor Q0 increases and in turn, a product cost rises.

If, in order to avoid deterioration of linearity when the RF output power is in the maximum amplitude, the base bias voltage of the transistor Q1 is set high, amplification of the power transistor Q0 becomes close to the A class when the amplitude is small, resulting in reducing efficiency.

In a case where a PNP transistor or an enhancement FET is employed as a power transistor, a problem similar to the above described occurs.

Further, JP 59-18275A discloses a voltage regulator circuit, in a power source for a thermal printing head, for suppressing a fall in power supply voltage caused by increase in an output current by means of employing a resistor through which the output current flows and performing feed-back control so that the voltage of the resistor may keep at a given value. However, this circuit is complex, working for the output current of about 10A, and not suitable for the purpose to suppress the change in the base bias voltage by tens of mV with a simple configuration.

SUMMARY OF THE INVENTION

Accordingly, it is an object of the present invention to provide a bias circuit for a control input of a power transistor, which can prevent efficiency and linearity of the power transistor from being deteriorated by a change in amplitude of an RF input power and which can be of a smaller size and requires reduced power consumption.

In one aspect of the present invention, there is provided a bias circuit for a control input of a power transistor, the bias circuit comprising an output transistor having a current path, one end of the current path providing a bias to the control input, the bias circuit further comprising: a current source, serially connected to the one end of the current path, having a control input, for flowing a current depending on a first potential at the control input thereof; and a current source control circuit, for detecting a second potential that changes depending on a change in current of the current path, for controlling the first potential in response to the second potential so that a sum of a current flowing to the control input of the power transistor and to the current source is approximately constant.

With this bias circuit, even though the amplitude of a signal provided to the control input of the power transistor increases and thereby a bias current flowing through the current path (between a collector and an emitter or between a drain and a source) of the power transistor increases, since the sum of both currents is controlled so as to be approximately constant, the current flowing through the output transistor is also approximately constant, so that linearity is prevented from being deteriorated by falling in control input potential of the power transistor.

Further, since the sum of both currents is approximately constant, the maximum value of the current flowing through the current source is limited to the maximum value of the current flowing to the control input of the power transistor, resulting in small power consumption.

Besides, by this limitation, a current source transistor that is necessary to control so as to keep the sum of both currents at approximately constant may be of about the same size as that of the output transistor, which enables the bias circuit to be down-sized.

Other aspects, objects, and the advantages of the present invention will become apparent from the following detailed description taken in connection with the accompanying drawings.

DESCRIPTION OF THE PREFERRED EMBODIMENTS

Figure 1:
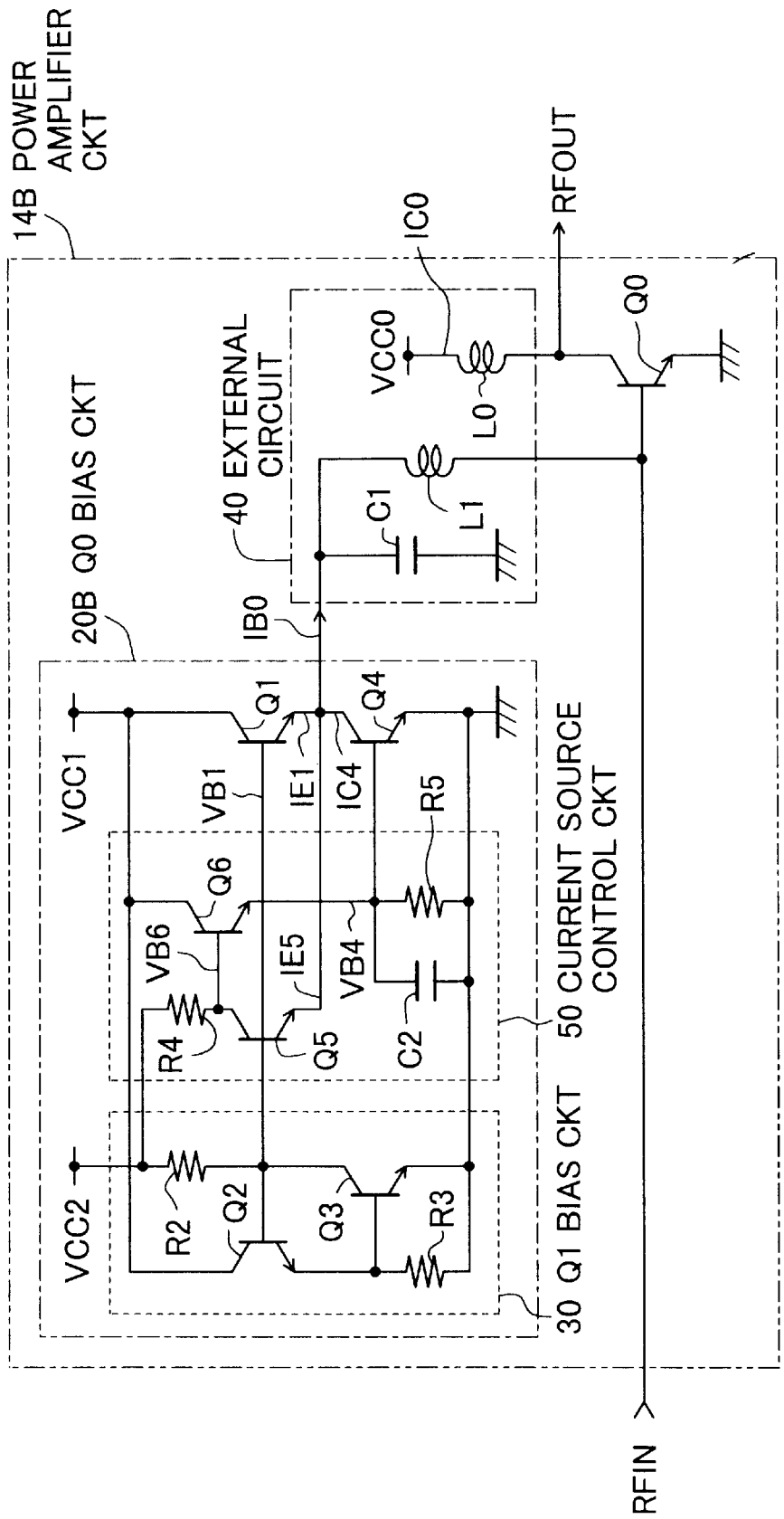
FIG. 1 is a diagram showing a power amplifier circuit of the first embodiment according to the present invention.

Referring now to the drawings, wherein like reference characters designate like or corresponding parts throughout several views, preferred embodiments of the present invention are described below. Although all the transistors in the drawings are NPN type, PNP type may be employed instead of NPN type with exchanging between higher and lower power supply potentials. In this case, current direction becomes reverse, and rise and fall of node potential also become reverse to the case employing NPN type.

First Embodiment

FIG. 1 shows a power amplifier circuit 14B of the first embodiment according to the present invention. The same constituents as those of FIG. 14 are indicated by the same reference characters and descriptions thereof are omitted.

Figure 14:
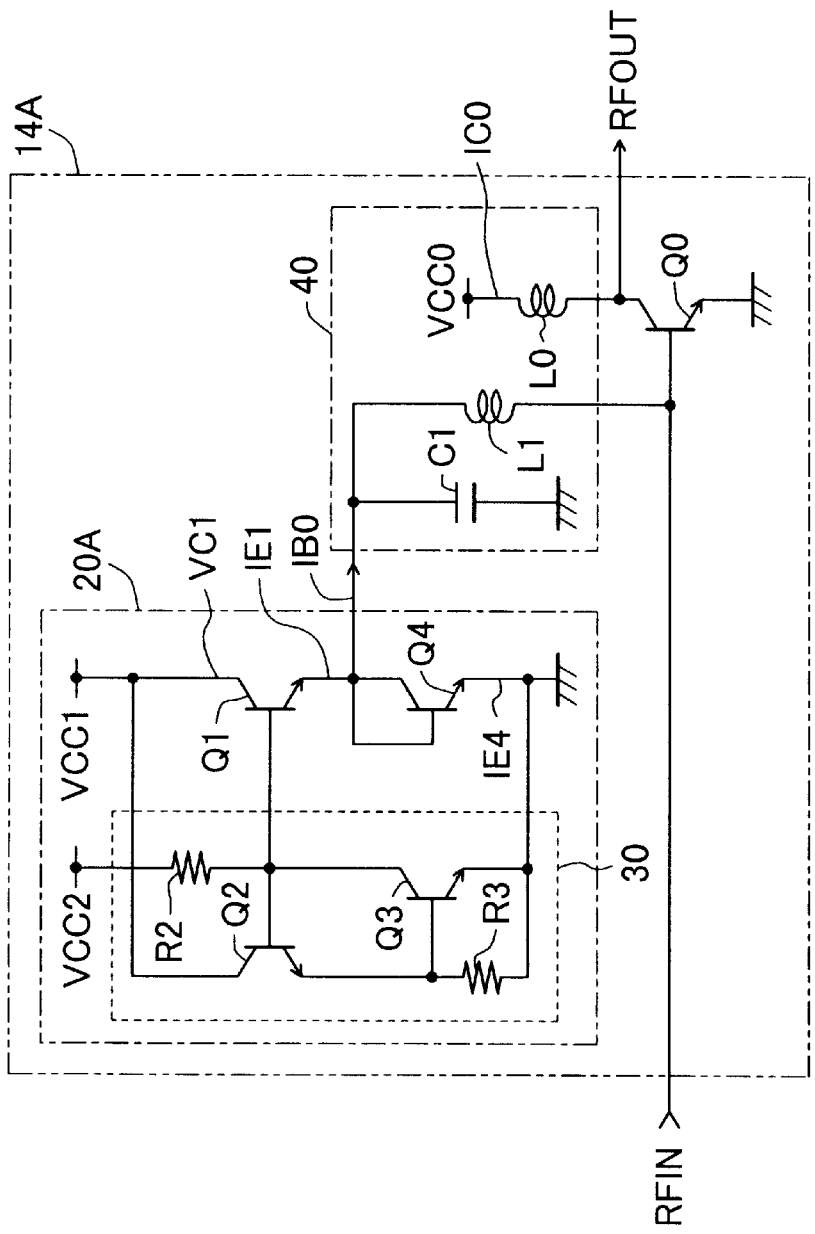
FIG. 14 is a diagram showing another prior art power amplifier circuit.

In a Q0 bias circuit 20B, a transistor Q4 functioning as a current source for providing a current depending on its base potential is employed instead of the transistor Q4 of FIG. 14 in diode connection functioning as the voltage source. The base potential is adjusted by a current source control circuit 50 so that, even though the base bias current IB0 of the power transistor Q0 changes, the emitter current IE1 of the transistor Q1 is kept approximately constant.

In the current source control circuit 50, in order to make a resistor R4 flow an emitter current IE5 which is proportional to the emitter current IE1 of the transistor Q1, the base and emitter of a transistor Q5 are respectively connected to the base and emitter of the transistor Q1, and the collector of the transistor Q5 is connected through the resistor R4 to a power supply VCC2. A ratio in quantity of the emitter current IE5 to the emitter current IE1 is equal to a ratio in size of the transistor Q5 to the transistor Q1. The sum of the emitter currents IE1 and IE5 is equal to the sum of the base bias current IB0 of the transistor Q0 and the collector current IC4 of the transistor Q4.

The potential at the current output of the resistor R4 is almost equal to (VCC2−IE5·R4), which is provided to the base of a transistor Q6, lowered by a voltage (VB6−VB4) between the base and emitter of the transistor Q6 and then provided to the base of the transistor Q4. In order to place the voltage (VB6−VB4) in a saturation state, the collector of the transistor Q6 is connected to the power supply potential VCC1 and the emitter thereof is connected through a resistor R5 to the ground line. The transistor Q6 and the resistor R5 constitute a level shift circuit. A capacitor C2 is connected in parallel to the resistor R5 to bypass an alternate current component to the ground line so as to prevent oscillation.

The other parts of the configuration are same as those of FIG. 14.

In the above described configuration, the base of the power transistor Q0 receives, on one hand, the RF input power RFIN which is a high frequency digital modulation signal, on the other hand, the base bias current IB0 which determines an operating point from the Q0 bias circuit 20B through the RF cut-off coil L1.

Figure 2A:
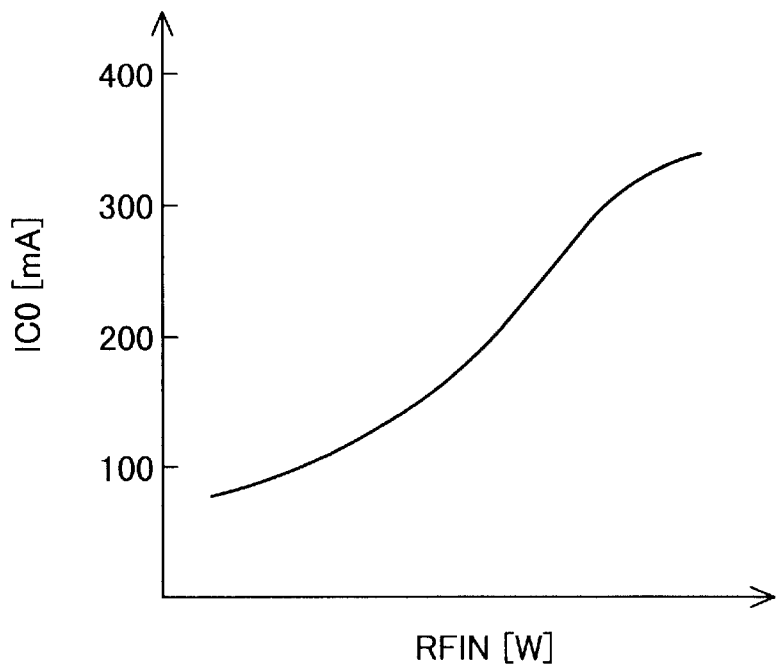
FIGS. 2(A) and (B) are schematic graphs respectively showing a collector bias current IC0 and a base bias current IB0 of a power transistor versus the amplitude of an RF input power RFIN provided to the base of the power transistor.
Figure 2B:
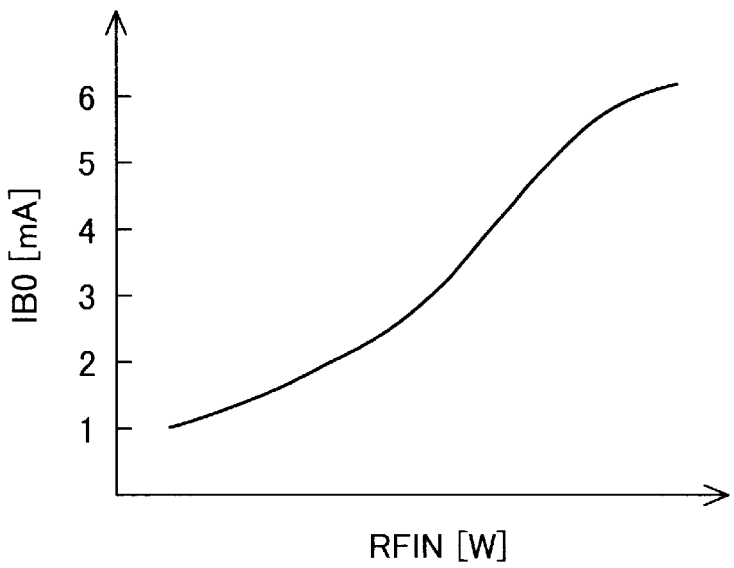
Figure 3:
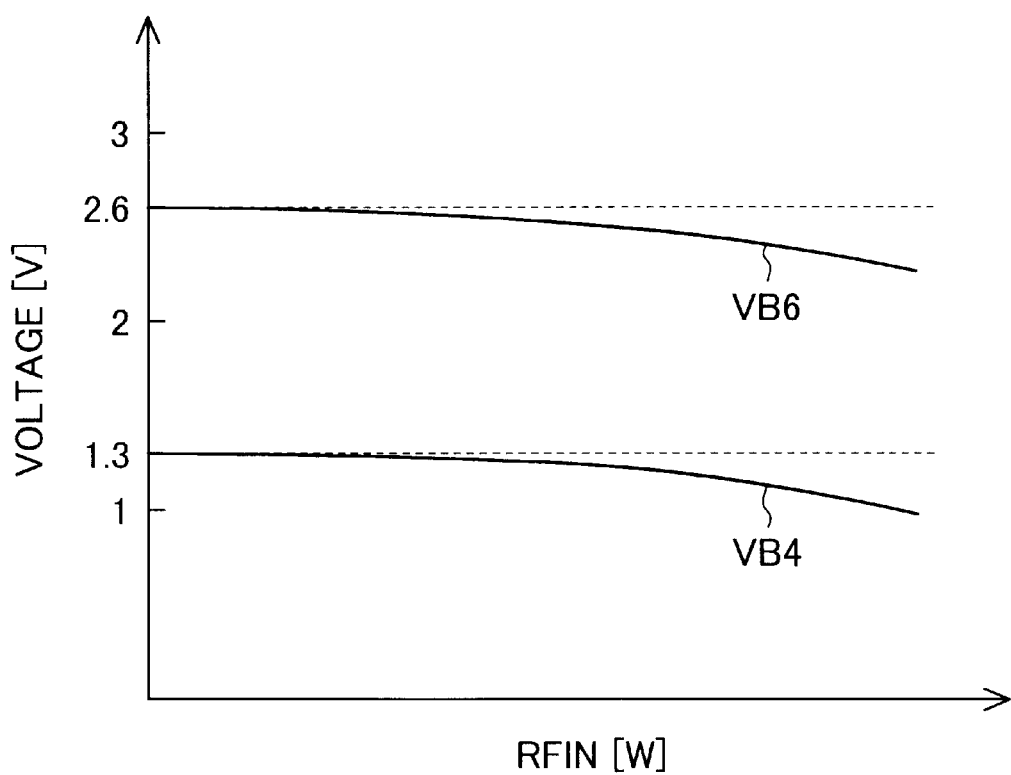
FIG. 3 is a graph showing the base potentials VB6 and VB4 of the transistors Q6 and Q4 in the circuit of FIG. 1 versus the amplitude of the RF input power RFIN.

As the amplitude of RFIN increases, the collector bias current IC0 increases and the base bias current IB0 increases in proportion to the increase in the collector current IC0. FIGS. 2(A) and 2(B) respectively show concrete examples of the collector bias current IC0 and the base bias current IB0 versus the amplitude of RFIN. As the base bias current IB0 increases, the current flowing through the resistor R4 is going to increase. With this increase, the base potential VB6 of the transistor Q6 decreases. Hence the base potential VB4 of the transistor Q4 decreases and the collector current IC4 thereof also decreases. FIG. 3 shows the base potentials VB6 and VB4 of the respective transistors Q6 and Q4 versus the amplitude of RFIN.

Since the collector current IC4 decreases with increase in the base bias current IB0, a change in the sum (IB0+IC4) of both currents is smaller and furthermore, changes in the emitter current IE1 and IE5 are smaller.

Figure 4:
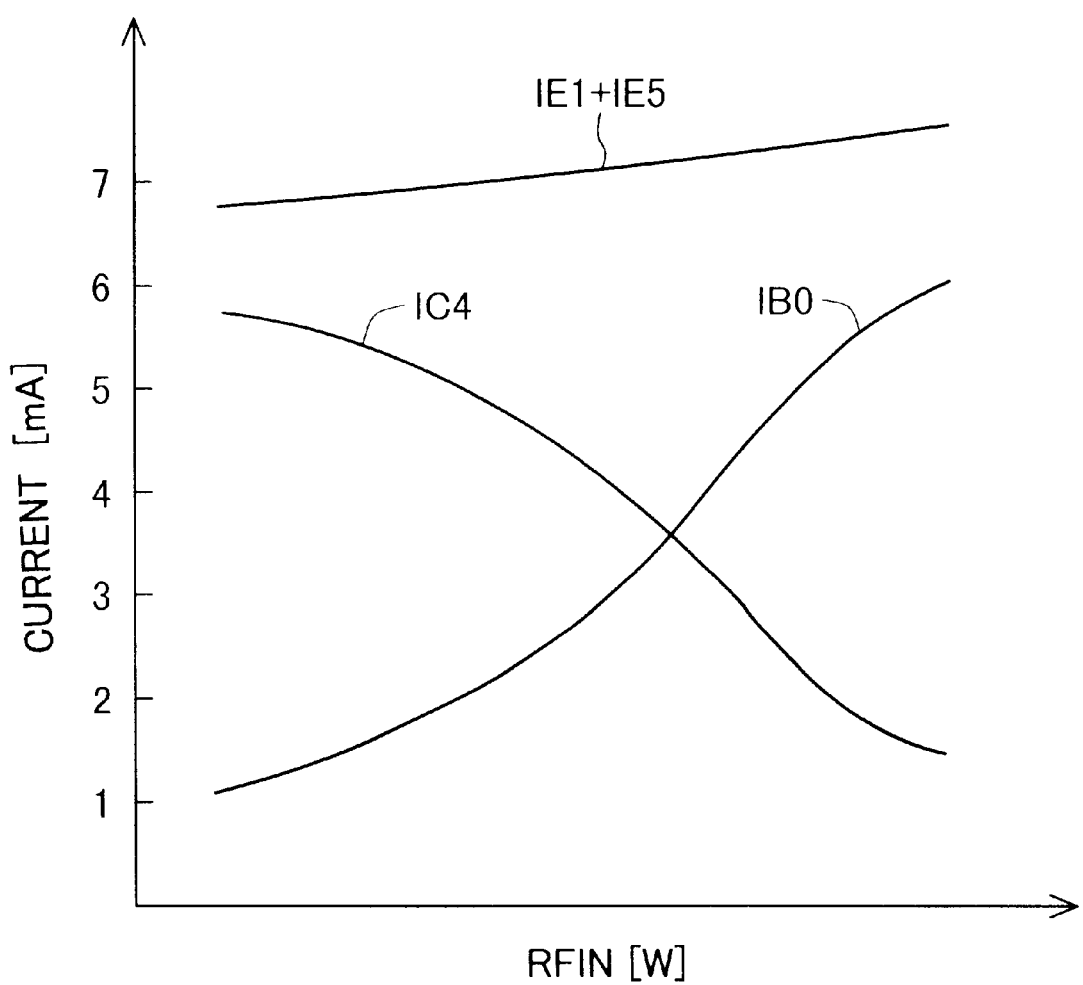
FIG. 4 is a graph showing the collector current IC4 of the transistor Q4, the base bias current IB0 of the power transistor Q0 in the circuit of FIG. 1 and a current (IE1+IE5) equal to the sum of both currents versus the amplitude of the RF input power RFIN.

FIG. 4 shows the collector current IC4 of the transistor Q4, the base bias current IB0 of the power transistor Q0 and the sum (IE1+IE5) of the emitter currents of the transistors Q1 and Q5 versus the amplitude of the RF input power RFIN.

With such operation, the base bias potential of the power transistor Q0 becomes approximately constant regardless of change in amplitude of RFIN, which prevents linearity from being deteriorated due to decrease in the base bias potential.

Even though the base bias current IB0 changes largely, the size of the transistor Q4 which is required for keeping the sum of the currents IB0 and IC4 to be approximately constant is about the sum of sizes of the transistors Q1 and Q5. Further, the level shift transistor Q6 can be small in size as compared with the output transistor Q1 since the transistor Q6 is only required to level-shift a received potential to provide the base of the transistor Q4.

Therefore, the size of the transistor Q4 in FIG. 1 can be much smaller than that of the transistor Q4 in FIG. 14, and even if the Q0 bias circuit 20B and the power transistor Q0 are incorporated in the same semiconductor chip, increase in the occupied area is small.

Furthermore, by falling the power supply potential VCC2 having a small current to 0V, the transistors Q0 to Q6 are turned off and also the base bias current decreases to zero, therefore there is no need to employ a power supply cut-off switch having a large capacity in order to cut off all the current of the power amplifier circuit 14B.

Concrete examples of circuit parameters are as follows: VCC0=3.5V, VCC1=3.5V, VCC2=2.8V R2=100Ω, R3=1kΩ, R4=100Ω, R5=3kΩ The size ratio of the transistors Q0 to Q6 is Q0: Q1: Q2: Q3: Q4: Q5: Q6=60:5:1:1:6:1:1.

Second Embodiment

Figure 5:
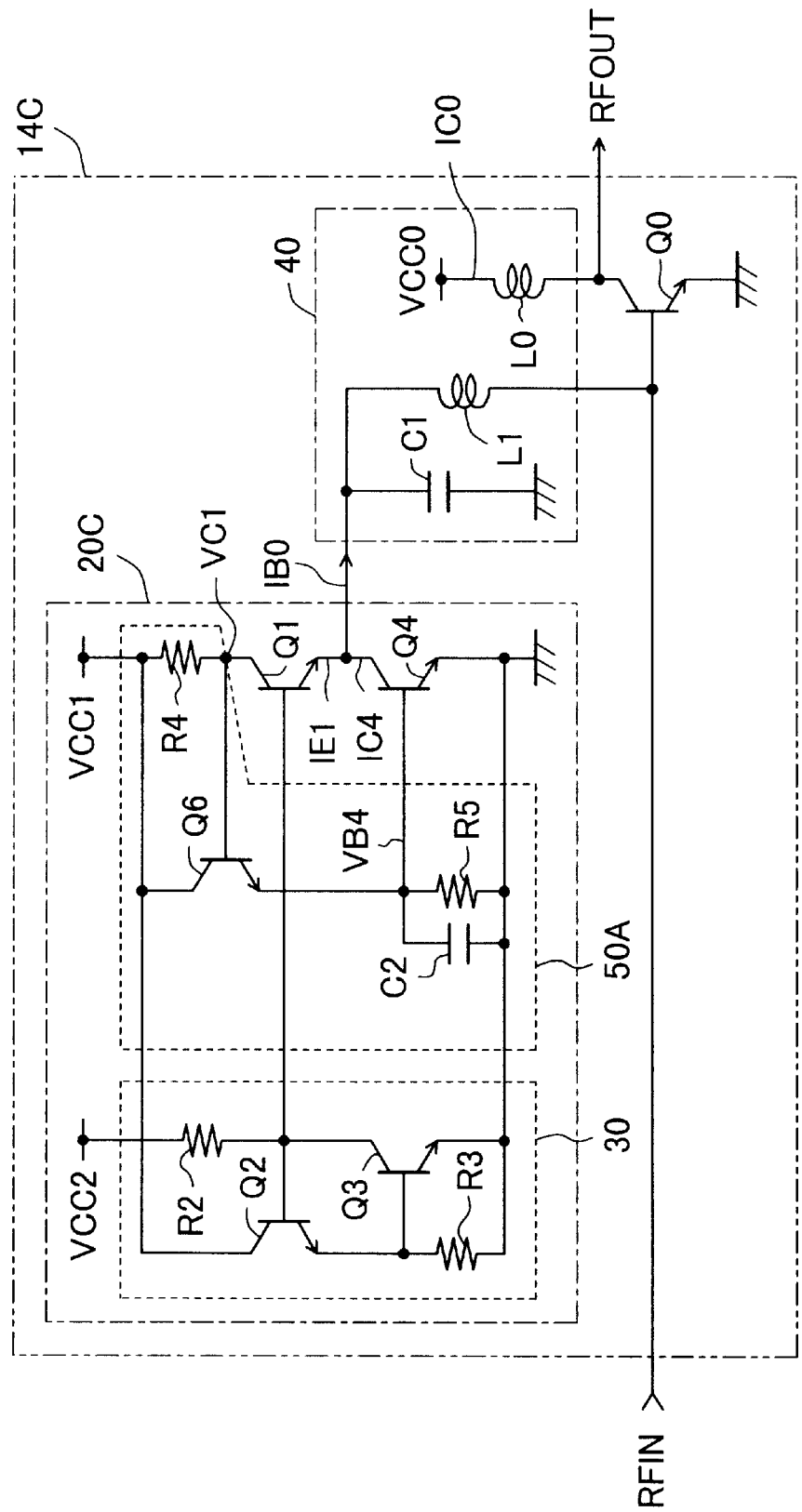
FIG. 5 is a diagram showing a power amplifier circuit of the second embodiment according to the present invention.

FIG. 5 shows a power amplifier circuit 14C of the second embodiment according to the present invention.

In a current source control circuit 50A of a Q0 bias circuit 20C, the transistor Q5 of FIG. 1 is omitted, the resistor R4 is connected between the power supply potential VCC1 and the collector of the transistor Q1 and the current output of the resistor R4 is connected to the base of the transistor Q6. The other parts of the configuration are same as those of FIG. 1.

Operation of the circuit is like as those of FIG. 1. But, since the emitter current IE5 of FIG. 1 is zero in this case, the relation of IE1=IC4+IB0 holds. Further, since the transistor Q6 operates even if the power supply potential VCC2 falls to 0V, the power supply potentials VCC1 and VCC2 are both required to fall to 0V in order to cut off all the current of the power amplifier circuit 14C.

Third Embodiment

Figure 6:
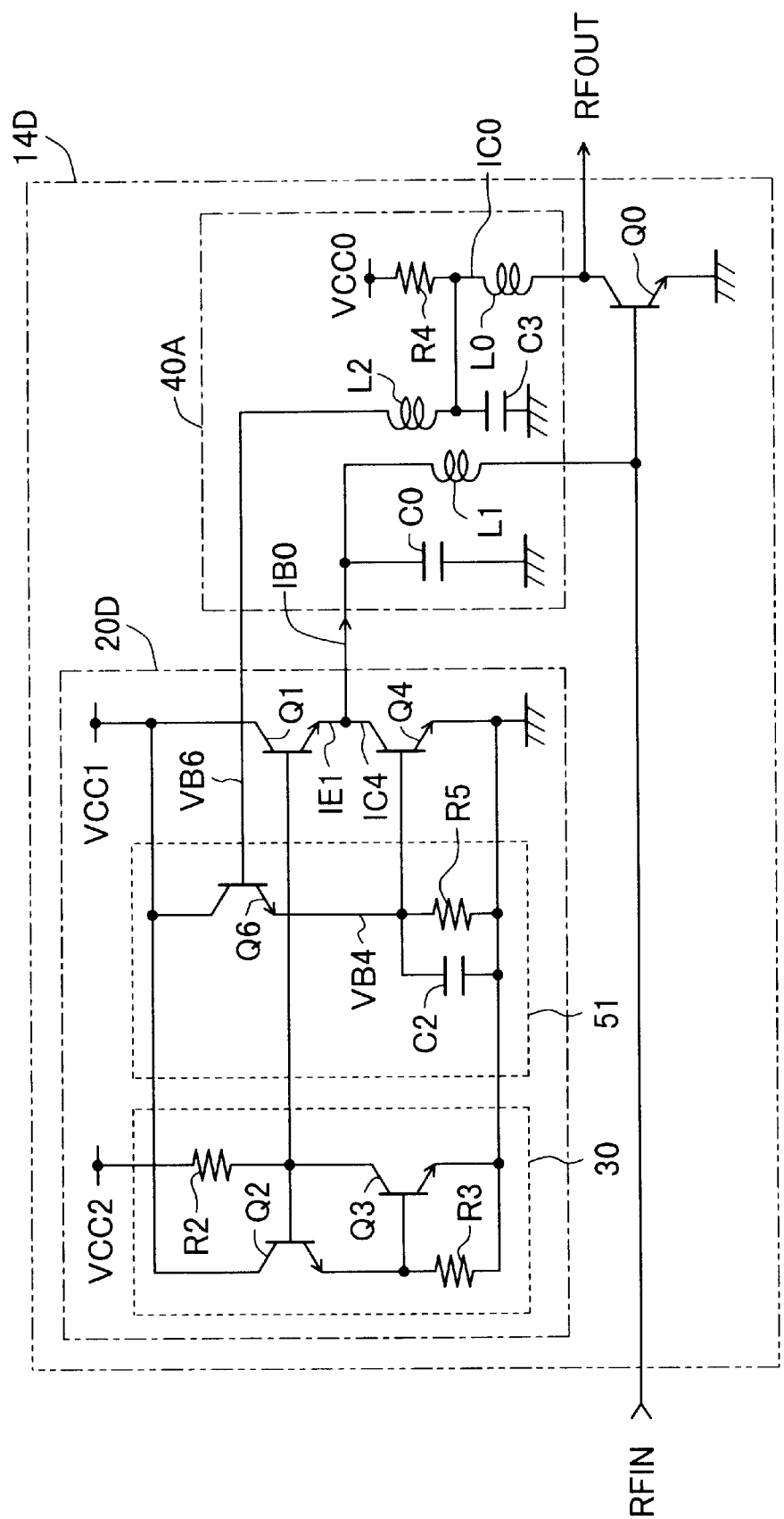
FIG. 6 is a diagram showing a power amplifier circuit of the third embodiment according to the present invention.

FIG. 6 shows a power amplifier circuit 14D of the third embodiment according to the present invention.

In the circuit, the resistor R4 is connected between the power supply VCC0 and the coil L0, the current output of the resistor R4 is connected through the coil L2 to the base of a transistor Q6. A control circuit for a current source transistor Q4 comprises the resistor R4 and a level shift circuit 51. A capacitor C3 is connected between the current output of the resistor R4 and the ground line, and a small portion of an RF signal having passed through the coil L0 from the collector of the power transistor Q0 is blocked at the coil L2 and absorbed in the capacitor C3. An external circuit 40A consists of the resistor R4, the coil L2, the capacitor C3 and the same circuit as the external circuit 40 of FIG. 5. The other parts of the configuration are same as those of FIG. 5.

As the base bias current IB0 increases, the collector bias current IC0 increases and the base potential VB6 decreases. Hence, operation similar to the case of FIG. 5 is performed.

Fourth Embodiment

Figure 7:
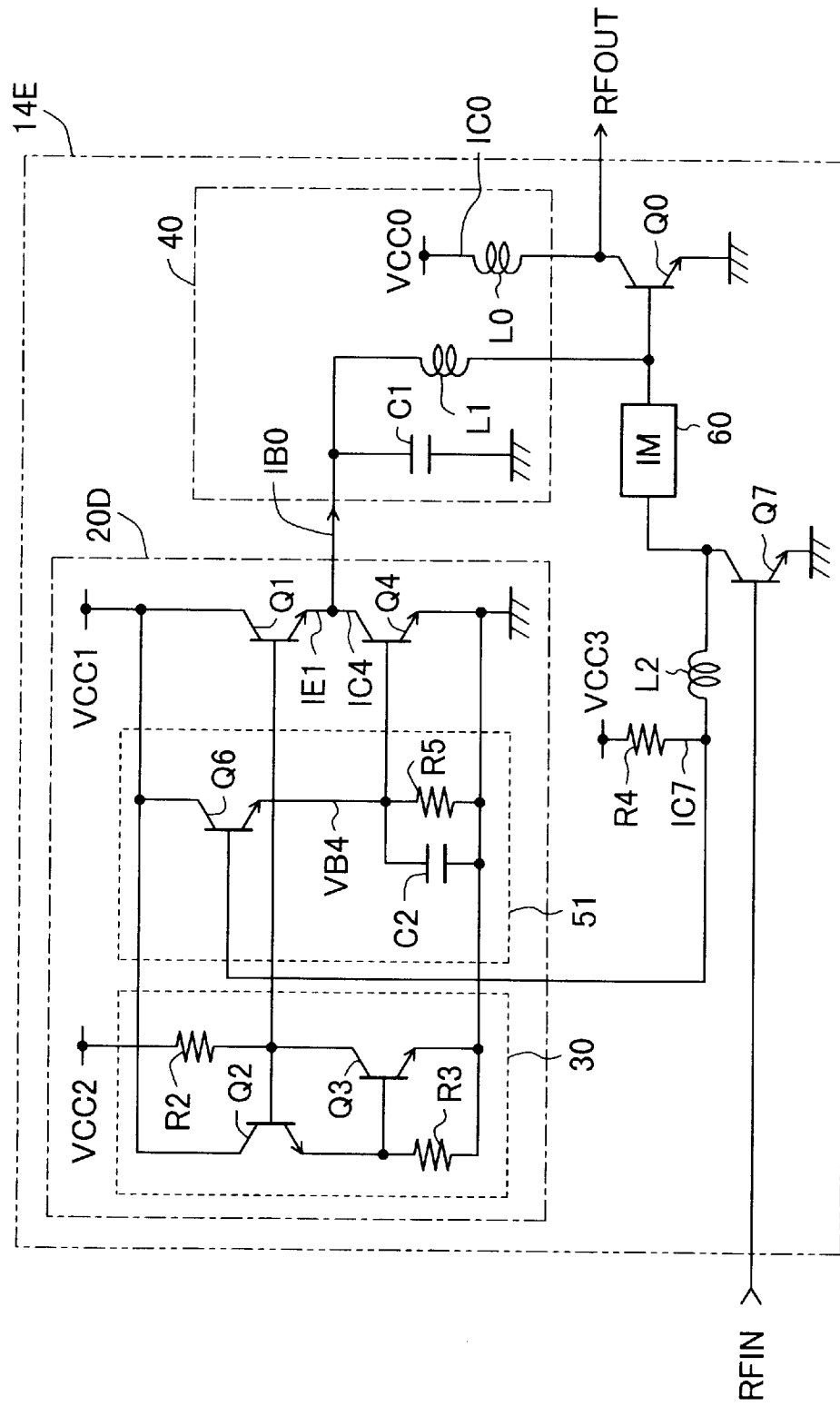
FIG. 7 is a diagram showing a power amplifier circuit of the fourth embodiment according to the present invention.

FIG. 7 shows a power amplifier circuit 14E of the fourth embodiment according to the present invention.

In the circuit, a preceding transistor Q7 has a cascade connection with the power transistor Q0. That is, the base of the transistor Q0 is connected through an impedance matching circuit 60 to the collector of the transistor Q7. The emitter of the transistor Q7 is grounded similar to the transistor Q0, and RFIN is provided to the base of the transistor Q7. The collector bias of the transistor Q7 is provided from a power supply potential VCC3 through the resistor R4 and a coil L2. The current output of the resistor R4 is connected to the base of a transistor Q6. The other parts of the configuration are same as those of FIG. 5. As the amplitude of RFIN increases, the current IC7 that flows through the resistor R4 increases, and the base potential of the transistor Q6 falls. Hence, operation similar to the case of FIG. 5 is performed.

Fifth Embodiment

Figure 8:
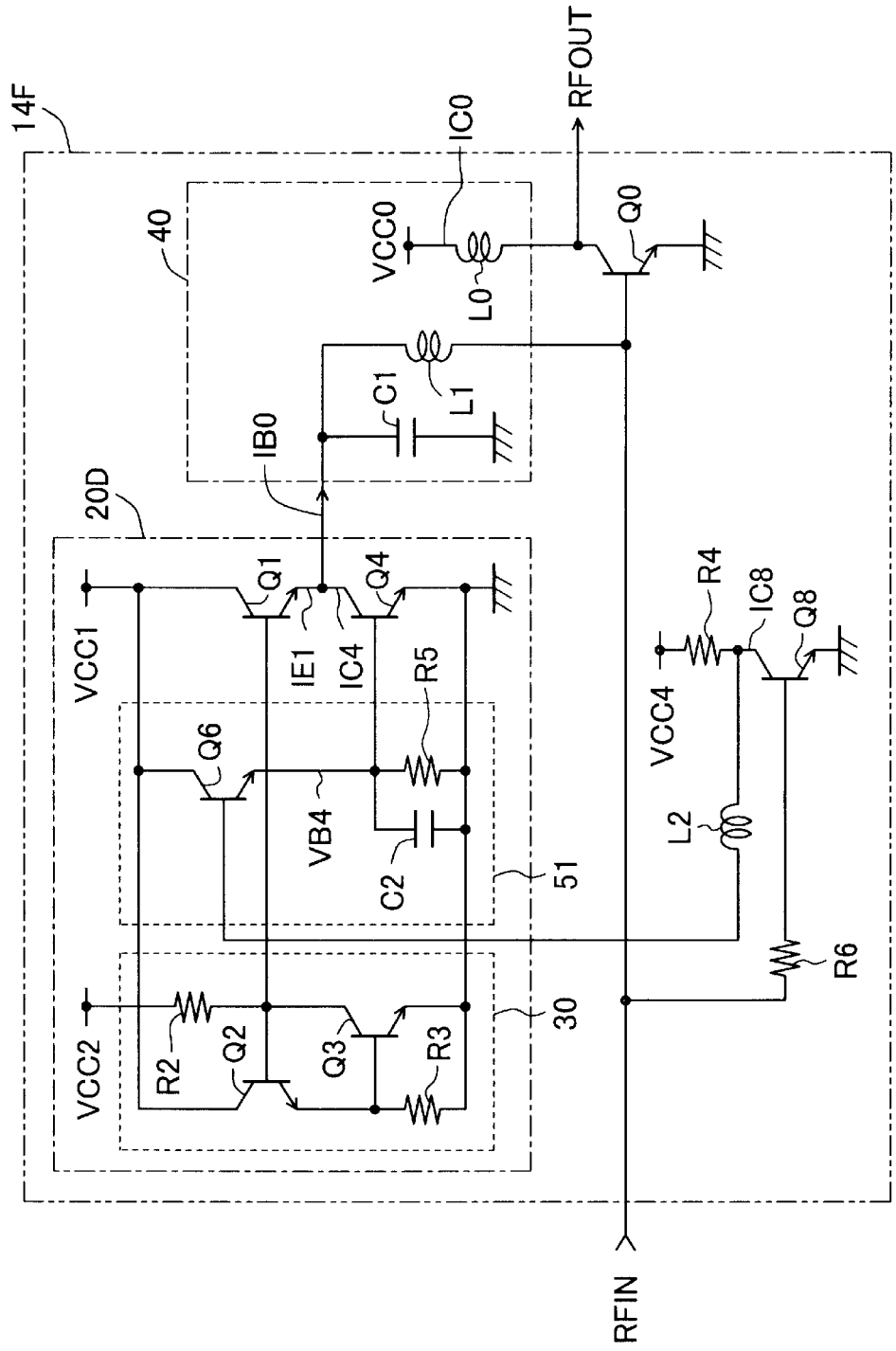
FIG. 8 is a diagram showing a power amplifier circuit of the fifth embodiment according to the present invention.

FIG. 8 shows a power amplifier circuit 14F of the fifth embodiment according to the present invention.

In the circuit, the base of the power transistor Q0 is connected through a current limiting resistor R6 to the base of a transistor Q8 in order to perform monitoring a portion of the base bias current IB0. The resistance of the resistor R6 is sufficient if it is about 10 times as large as the input resistance of the power transistor Q0, which is generally smaller than 1Ω. The collector of the monitoring transistor Q8 is connected to a power supply potential VCC4 through the resistor R4 and the emitter thereof is grounded. The current output of the resistor R4 is connected to the base of the transistor Q6 through the RF signal cur-off coil L2. The other parts of the configuration are same as those of FIG. 5.

As the amplitude of RFIN increases, the base bias current IB0 increases, the current that flows through the resistor R6 increases and the base potential of the transistor Q6 decreases. Hence, operation similar to the case of FIG. 5 is performed.

It should be noted that it may alternatively be adopted in the configuration that the coil L2 is removed, and the coil is cascaded to the resistor R6.

Sixth Embodiment

Figure 9:
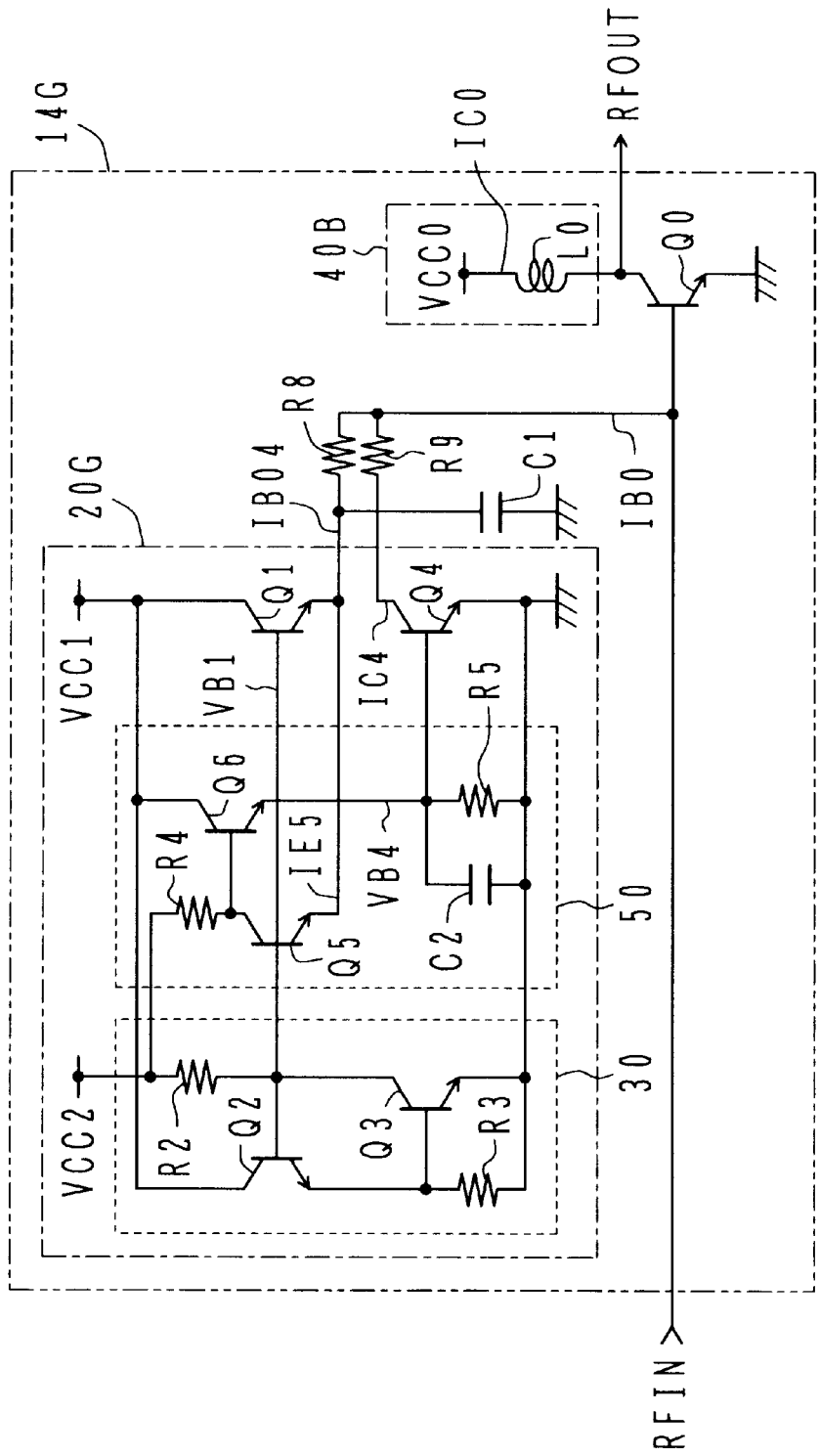
FIG. 9 is a diagram showing a power amplifier circuit of the sixth embodiment according to the present invention.

FIG. 9 shows a power amplifier circuit 14G of the sixth embodiment according to the present invention.

In FIG. 1, if a resistor is employed instead of the coil L1 to cut off transmission of RFIN to the Q0 bias circuit 20B, the resistor can be formed within a semiconductor chip. Hence, external circuit components can be decreased in number so as to further scale down the power amplifier circuit 14B. However, a simple replacement of the coil L1 with the resistor is not proper since the linearity of the power transistor Q0 is deteriorated with falling in the base potential thereof due to increase in the base bias current IB0.

Therefore, in the circuit of FIG. 9, an RF signal cut-off resistor R8 is connected between the emitter of the transistor Q1 and the base of the power transistor Q0, and another RF signal cur-off resistor R9 is connected between the collector of the transistor Q4 and the base of the power transistor Q0. A Q0 bias circuit 20G is different from the Q0 bias circuit 20 of FIG. 1 in that the emitter of the transistor Q1 and the collector of the transistor Q4 is not directly connected to each other. The other parts of the configuration are same as those of FIG. 1.

With the above described configuration, since the current IB04=IE1+IE5 that flows through the resistor R8 is kept approximately constant as described above even though the base bias current IB0 changes, the base potential of the power transistor Q0 stays at approximately constant. The capacitor C1 is connected between the emitter of the transistor Q1 and the ground line, and an RF signal that is attenuated by the resistor R8 is further absorbed in the capacitor C1.

According to the power amplifier circuit 14G, an external circuit 40B has only coil L0, thereby enabling more of down-scaling of the power amplifier circuit 14G than that of FIG. 1.

Seventh Embodiment

Figure 10:
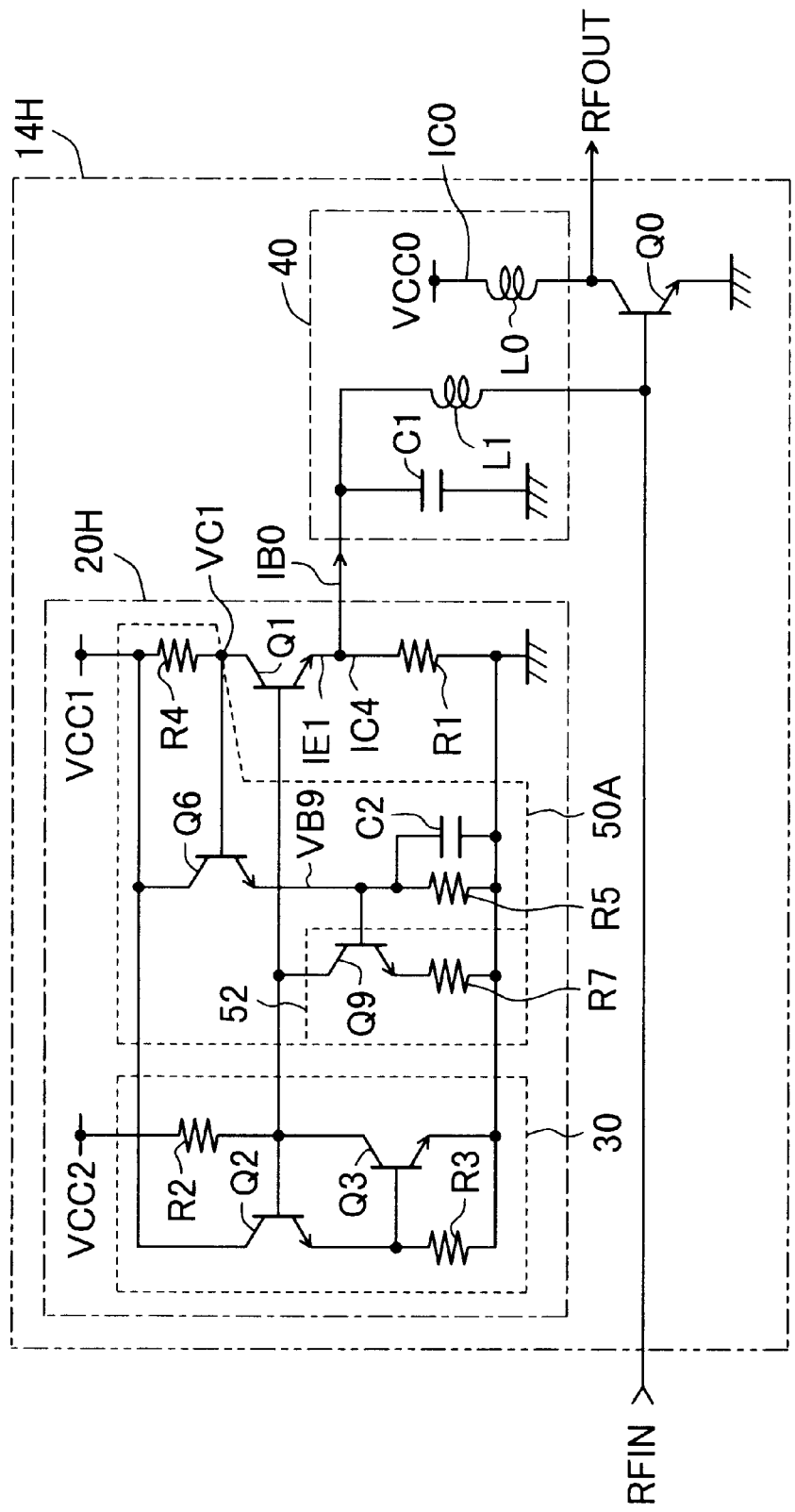
FIG. 10 is a diagram showing a power amplifier circuit of the seventh embodiment according to the present invention.

FIG. 10 shows a power amplifier circuit 14H of the seventh embodiment according to the present invention.

Figure 13:
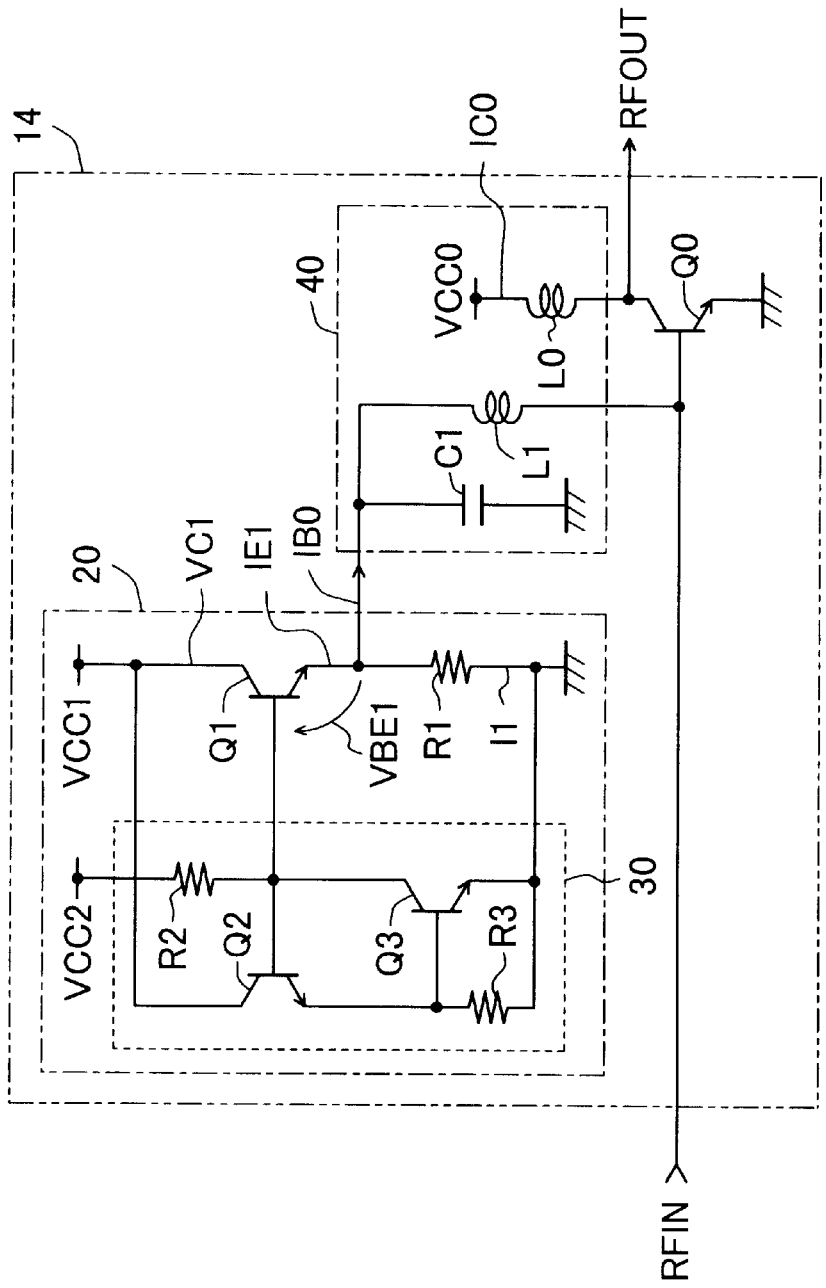
FIG. 13 is a diagram showing a prior art power amplifier circuit in FIG. 12.

In a Q0 bias circuit 20H, a current source 52 is connected between the base of the transistor Q1 and the ground line. In the current source 52, a transistor Q9 and a current limiting resistor R7 are serially connected and the current depending on the base potential of the transistor Q9 flows. The base potential is adjusted by the emitter potential of the transistor Q6 of a current source control circuit 50A. The circuit 50A is same as that of FIG. 5. The emitter of the transistor Q1 is connected through the resistor R1 to the ground line. The resistance of the resistor R1 can be larger than the resistor R1 in FIG. 13 due to the flowing operation. The other parts of the configuration are same as those of FIG. 5.

As the amplitude of RFIN increases, the base bias current IB0 increases, the current that flows through the resister R4 increases, the base potentials of the transistors Q6 and Q9 falls and the current that flows through the current source 52 decreases. Since this current is provided through the resistor R2, the current that flows through the resistor R2 decreases and the base potential of the transistor Q1 rises.

Therefore, when the voltage between the base and emitter of the transistor Q1 increases due to increase in the base bias current IB0, falling of the base potential of the power transistor Q0 is suppressed due to rise in the base potential of the transistor Q1, thereby preventing deterioration of linearity of the power transistor Q0.

In a case where a radio communication state becomes good, the power transistor Q0 outputs a small RF power and the base bias current IB0 decreases, since the base potential VB9 rises and the currents that flow through the current source 52 and the resistor R2 increase, the base potential of the transistor Q1 falls and the base potential of the power transistor Q0 also falls. In a case where RFIN has a small amplitude, since no distortion due to clipping arises even though the base potential of the power transistor Q0 falls, there arise no problem, and to the contrary it is prefer since power consumption of the power transistor Q0 is reduced.

Figure 11:
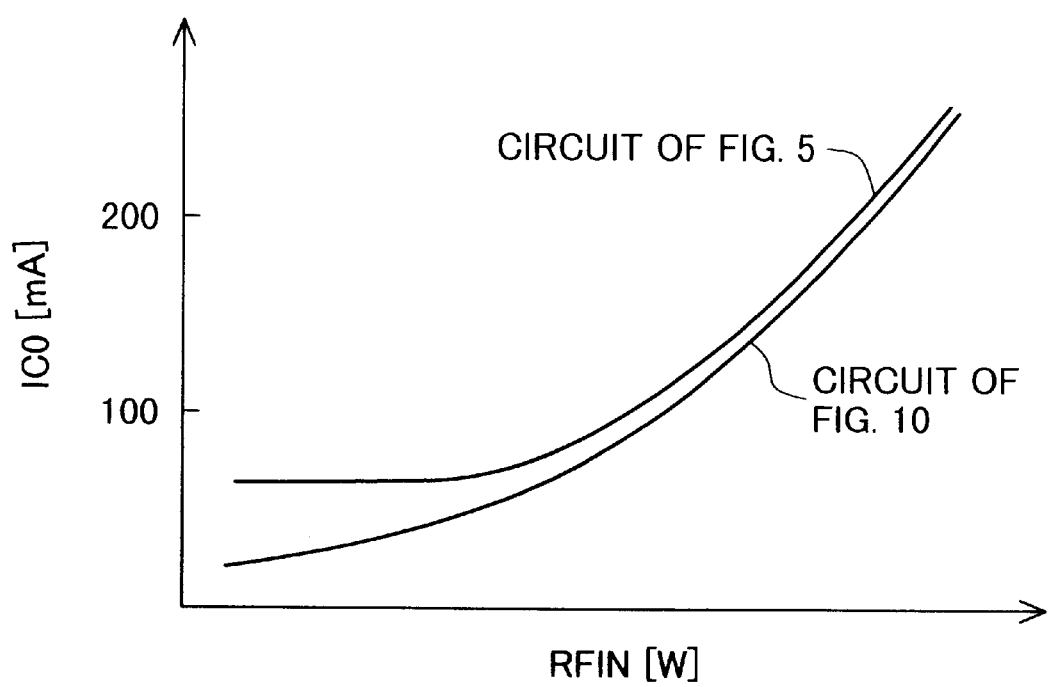
FIG. 11 is a graph showing the collector bias currents IC0 of the power transistor Q0 in the circuits of FIGS. 10 and 5 versus the amplitude of the RF input power RFIN.
Figure 12:
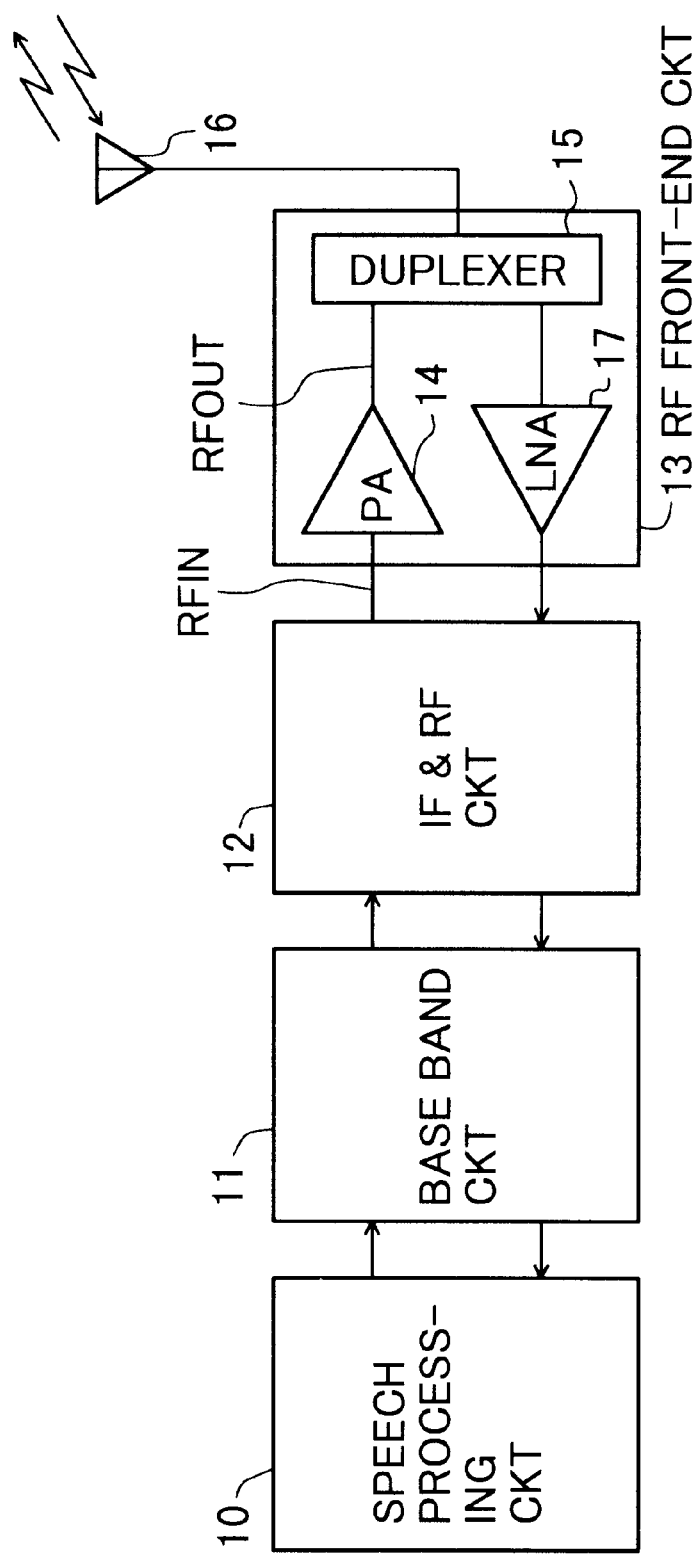
FIG. 12 is a schematic block diagram showing a prior art portable telephone.

FIG. 11 shows the collector bias currents IC0 of the power transistor Q0 in the circuits of FIGS. 10 and 5 versus the amplitude of the RF input power RFIN.

Although preferred embodiments of the present invention has been described, it is to be understood that the invention is not limited thereto and that various changes and modifications may be made without departing from the spirit and scope of the invention.

For example, in the circuit of FIG. 10, the current source control circuit 50 of FIG. 1 or the combination of the level shift circuit 51 and the resistor R4 in FIGS. 6 to 8 may be employed instead of the current source control circuit 50A. In FIGS. 5 to 8, the RF cut-off resistors R6 and R9 in FIG. 9 may be employed instead of the RF cut-off coil.

Furthermore, as a load element, it is not limited to a resistor, but a diode (including a transistor in diode connection) may be employed.

Still further, as transistors in a bias circuit, FETs may be employed instead of bipolar transistors. In a case where FETs are employed, an emitter follower circuit corresponds to a source follower circuit. As a power transistor, an enhancement type FET may be employed instead of a bipolar transistor.

Further, a bias circuit according to the present invention is applicable for various circuits, each of which needs a constant voltage source, such as a mixer, a VCO (voltage controlled oscillator), and a LNA (low noise amplifier).

Besides, a power amplifier circuit according to the present invention is applicable for a radio communication device such as an information portable terminal and a radio LAN with high frequency.

What is claimed is:

1. A bias circuit for a control input of a power transistor, said bias circuit comprising an output transistor having a current path, one end of said current path providing a bias to said control input, said bias circuit further comprising:

a current source, serially connected to said one end of said current path, having a control input, for flowing a current depending on a first potential at said control input thereof; and a current source control circuit, for detecting a second potential that changes depending on a change in current of said current path, for controlling said first potential in response to said second potential so that a current flowing to said current source changes in reverse to said current change of said current path in order to maintain a sum of a current flowing to said control input of said power transistor and to said current source approximately constant.

2. A bias circuit according to claim 1, wherein said power transistor and said output transistor each are bipolar transistors, said bias is a base bias current, and said one end of said current path is an emitter.

3. A bias circuit according to claim 2, wherein said current source control circuit comprises:
- a detection circuit for detecting said second potential that depends on said current of said current path; and
- a level shift circuit for level-shifting said second potential to make said first potential.

4. A bias circuit according to claim 3, wherein said level shift circuit comprises:
- a level shift transistor having a collector, a base and an emitter connected to a first power supply potential, said second potential and said control input of said current source, respectively; and
- a load element connected between said emitter of said level shift transistor and a second power supply potential.

5. A bias circuit according to claim 3,
wherein said detection circuit comprises a load element connected so that a current approximately proportional to a dc component of a collector current of said power transistor flows therethrough,
wherein one end of said load element has said second potential.

6. A bias circuit according to claim 5, wherein said detection circuit further comprises:
- an emitter follower transistor having a base and an emitter connected to a base and said emitter of said output transistor, respectively,
wherein said load element is connected between a collector of said emitter follower transistor and said first power supply potential.

7. A bias circuit according to claim 5, wherein said load element is connected between a collector of said output transistor and said first power supply potential.

8. A bias circuit according to claim 5, wherein a collector bias current of said power transistor flows through said load element.

9. A bias circuit according to claim 5, further comprising:
- a preceding transistor having a cascade connection with said power transistor,
wherein a collector bias current of said preceding transistor flows through said load element.

10. A bias circuit according to claim 5, further comprising:
- a monitoring transistor for monitoring and amplifying a portion of a signal provided to a base of said power transistor,
wherein a current flowing through said monitoring transistor flows through said load element.

11. A bias circuit according to claim 2, further comprising:
- a first resistor, connected between said emitter of said output transistor and a base of said power transistor, having a resistance larger than an input resistance of said power transistor; and
- a second resistor, connected between a current input of said current source and said base of said power transistor, having a resistance larger than said input resistance of said power transistor.

12. A bias circuit for a control input of a power transistor, said bias circuit comprising an output transistor having a current path and a control input, one end of said current path providing a bias to said control input of said power transistor, said bias circuit further comprising:
- a bias resistor connected between a power supply potential and said control input of said output transistor;
- a current source, having a current path connected to said control input of said output transistor, having a control input, for flowing a current through said current path thereof depending on a first potential at said control input thereof; and
- a current source control circuit, for detecting a second potential that changes depending on a change in current flowing through said current path of said output transistor, for controlling said first potential in response to said second potential so that a change in current flowing through said current path of said current source is reverse to a change in current flowing through said current path of said output transistor.

13. A bias circuit according to claim 12, wherein said power transistor and said output transistor each are bipolar transistors, said bias to said control input of said power transistor is a base bias current, and said one end of said current path is an emitter.

14. A bias circuit according to claim 13, wherein said current source control circuit comprises:
- a detection circuit for detecting said second potential that depends on said current flowing through said current path of said output transistor; and
- a level shift circuit for level-shifting said second potential to make said first potential.

15. A bias circuit according to claim 14, wherein said level shift circuit comprises:
- a level shift transistor having a collector, a base and an emitter connected to a first power supply potential, second potential and said control input of said current source, respectively; and
- a load element connected between said emitter of said level shift transistor and a second power supply potential.

16. A bias circuit according to claim 14,
wherein said detection circuit comprises a load element connected so that a current approximately proportional to a dc component of a collector current of said power transistor flows therethrough,
wherein one end of said load element has said second potential.

17. A bias circuit according to claim 16, wherein said load element is connected between a collector of said output transistor and said first power supply potential.

18. A bias circuit according to claim 17, wherein said current source comprises:
- a current source transistor and a current limiting resistor both being serially connected to each other between a base of said output transistor and a power supply potential,
wherein a base of said current source transistor is said control input of said current source.

19. A bias circuit according to claim 2, further comprising:
- two PN junctions serially connected to each other between a base of said output transistor and an emitter of said power transistor so that a forward current flows through said two PN junctions.

20. A bias circuit according to claim 13, further comprising:
- two PN junctions serially connected to each other between a base of said output transistor and an emitter of said power transistor so that a forward current flows through said two PN junctions.

21. A power amplifier circuit comprising:

a power transistor having a control input; and a bias circuit for said control input, wherein said bias circuit comprises:

an output transistor having a current path, one end of said current path providing a bias to said control input;

a current source, serially connected to said one end of said current path, having a control input, for flowing a current depending on a first potential at said control input thereof; and a current source control circuit, for detecting a second potential that changes depending on a change in current of said current path, for controlling said first potential in response to said second potential so that a sum of a current flowing to said control input of said power transistor and to said current source is approximately constant.

* * * * *